(12) United States Patent
Li et al.

(10) Patent No.: US 12,317,650 B2
(45) Date of Patent: May 27, 2025

(54) LIGHT EMITTING BASE PLATE AND FABRICATING METHOD THEREOF, AND DISPLAYING DEVICE

(71) Applicant: BOE Technology Group Co., Ltd., Beijing (CN)

(72) Inventors: Shipei Li, Beijing (CN); Ying Zhao, Beijing (CN); Wei He, Beijing (CN); Zhiwei Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 536 days.

(21) Appl. No.: 17/308,285

(22) Filed: May 5, 2021

(65) Prior Publication Data

US 2022/0123178 A1 Apr. 21, 2022

(30) Foreign Application Priority Data

Oct. 20, 2020 (CN) .......................... 202011127028.3

(51) Int. Cl.
*H10H 20/01* (2025.01)
*H10H 20/831* (2025.01)
(Continued)

(52) U.S. Cl.
CPC ............ *H10H 20/84* (2025.01); *H10H 20/01* (2025.01); *H10H 20/8312* (2025.01);
(Continued)

(58) Field of Classification Search
CPC ........... H01L 27/156; H01L 2933/0025; H01L 2933/0066; H01L 33/005; H01L 33/38;
(Continued)

(56) References Cited

U.S. PATENT DOCUMENTS

2006/0262242 A1 11/2006 Koma
2010/0283069 A1* 11/2010 Rogers ................ H01L 31/1804
257/E31.127
(Continued)

FOREIGN PATENT DOCUMENTS

CN 104808391 A 7/2015
CN 105870134 A 8/2016
(Continued)

OTHER PUBLICATIONS

Office Action dated Oct. 27, 2022, issued in counterpart CN Application No. 202011127028.3, with English Translation. (17 pages).

*Primary Examiner* — Meiya Li
(74) *Attorney, Agent, or Firm* — WHDA, LLP

(57) ABSTRACT

A light emitting base plate and a fabricating method thereof, and a displaying device. In the present disclosure, a light shielding layer is provided on a substrate, a driving functional layer is provided on the light shielding layer, and a light-emitting-device layer and a light absorbing layer are provided on the driving functional layer; the light-emitting-device layer includes a plurality of light emitting devices, and the light absorbing layer includes light absorbing structures each of which surrounds sides of one of the light emitting devices; and the light absorbing structures are configured for blocking light rays exiting from the sides of the light emitting devices.

8 Claims, 7 Drawing Sheets

(51) Int. Cl.
    *H10H 20/84* (2025.01)
    *H10H 20/857* (2025.01)
    *H10H 29/14* (2025.01)

(52) U.S. Cl.
    CPC ........ *H10H 20/857* (2025.01); *H10H 29/142* (2025.01); *H10H 20/034* (2025.01); *H10H 20/0364* (2025.01)

(58) Field of Classification Search
    CPC ....... H01L 33/382; H01L 33/44; H01L 33/62; H10H 20/01; H10H 20/034; H10H 20/0364; H10H 20/831; H10H 20/8312; H10H 20/84; H10H 20/857; H10H 29/142
    See application file for complete search history.

(56) References Cited

U.S. PATENT DOCUMENTS

| | | |
|---|---|---|
| 2017/0262088 A1 | 9/2017 | Wang et al. |
| 2018/0299081 A1 | 10/2018 | Zhu |
| 2019/0115410 A1 | 4/2019 | Zhu et al. |
| 2019/0214376 A1* | 7/2019 | Kim .................... H01L 33/504 |

FOREIGN PATENT DOCUMENTS

| | | | |
|---|---|---|---|
| CN | 106907620 A | 6/2017 | |
| CN | 107101176 A | 8/2017 | |
| JP | 2000075293 A | 3/2000 | |
| JP | 2007041536 A | 2/2007 | |

* cited by examiner

| forming a light shielding layer on a substrate | ~601 |

| forming a driving functional layer on the light shielding layer | ~602 |

| forming a light-emitting-device layer and a light absorbing layer on the driving functional layer | ~603 |

LIGHT EMITTING BASE PLATE AND FABRICATING METHOD THEREOF, AND DISPLAYING DEVICE

CROSS REFERENCE TO RELEVANT APPLICATIONS

The present disclosure claims the priority of the Chinese patent application filed on Oct. 20, 2020 before the Chinese Patent Office with the application number of 202011127028.3 and the title of "FRONTALLY PLACED LIGHT SOURCE AND FABRICATING METHOD THEREOF, AND DISPLAYING DEVICE", which is incorporated herein in its entirety by reference.

TECHNICAL FIELD

The present disclosure relates to the technical field of displaying, and particularly relates to a light emitting base plate and a fabricating method thereof, and a displaying device.

BACKGROUND

With the development of displaying techniques, reflection-type Liquid Crystal Displays (LCD), because of their advantages over transmission-type LCDs such as energy saving and eye nourishment, are being extensively applied to fields such as wearable devices, electronic labels and electronic books.

Currently, reflection-type LCDs comprises a display panel and a frontally placed light source. When the external ambient light is intensive, the frontally placed light source is shut down, and the display panel directly reflects the ambient light to display. However, when the external ambient light is weak, the frontally placed light source is required to supply light rays to realize the displaying.

SUMMARY

The present disclosure provides a light emitting base plate and a fabricating method thereof, and a displaying device.

The present disclosure discloses a light emitting base plate, wherein the light emitting base plate comprises: a substrate;
  a light shielding layer, provided on the substrate;
  a driving functional layer, provided on the light shielding layer;
  a light-emitting-device layer, provided on the driving functional layer, wherein the light-emitting-device layer comprises a plurality of light emitting devices; and
  a light absorbing layer, provided on the driving functional layer, wherein the light absorbing layer comprises light absorbing structures each of which surrounds sides of one of the light emitting devices, wherein the sides of the light emitting device refer to surfaces of the light emitting device that are in a direction perpendicular to the substrate;
  wherein the light absorbing structures are configured for blocking light rays exiting from the sides of the light emitting devices.

Optionally, the driving functional layer comprises a first passivation layer, a first electrically conductive layer, a second passivation layer, a second electrically conductive layer and a third electrically conductive layer that are provided sequentially on the light shielding layer; and
  the second electrically conductive layer is connected to the first electrically conductive layer via a first via hole penetrating the second passivation layer, and the third electrically conductive layer comprises a first electrically conductive structure and a second electrically conductive structure.

Optionally, each of the light emitting devices comprises an anode lead and a cathode lead; and
  the anode lead is connected to the first electrically conductive structure, and the cathode lead is connected to the second electrically conductive structure.

Optionally, the driving functional layer further comprises a flat layer provided between the light shielding layer and the first passivation layer; and
  in the direction perpendicular to the substrate, a height of the anode lead and a height of the cathode lead are equal, a thickness of the flat layer at a position that corresponds to the anode lead and a thickness of the flat layer at a position that corresponds to the cathode lead are equal, and a thickness of the first passivation layer at a position that corresponds to the anode lead and a thickness of the first passivation layer at a position that corresponds to the cathode lead are equal;
  or, in the direction perpendicular to the substrate, a height of the anode lead and a height of the cathode lead are not equal, and, at a position corresponding to the anode lead or the cathode lead whoever has a maximum height, each of the flat layer and the first passivation layer has a depressed structure that depresses in a direction toward the substrate.

Optionally, the driving functional layer further comprises a third passivation layer provided on a side of the third electrically conductive layer that is further away from the substrate; and
  the third passivation layer is provided with a second via hole exposing the first electrically conductive structure, and a third via hole exposing the second electrically conductive structure.

Optionally, the anode lead is connected to the first electrically conductive structure via the second via hole penetrating the third passivation layer, and the cathode lead is connected to the second electrically conductive structure via the third via hole penetrating the third passivation layer.

Optionally, the first electrically conductive layer comprises a plurality of first electrically conductive lead wires that are distributed in a first direction, the second electrically conductive layer comprises a plurality of second electrically conductive lead wires that are distributed in a second direction, the first direction and the second direction have a preset included angle, and the preset included angle is not 0.

Optionally, all of an orthographic projection of the first electrically conductive layer on the substrate, an orthographic projection of the second electrically conductive layer on the substrate and an orthographic projection of each of the light emitting devices on the substrate are located within an orthographic projection of the light shielding layer on the substrate.

Optionally, a distance from a surface of a side of the light absorbing structure that is further away from the substrate to the substrate is less than or equal to a distance from a surface of a side of the light emitting device that is further away from the substrate to the substrate.

Optionally, the light emitting base plate further comprises a leveling layer provided on the driving functional layer, and a bonding layer covering the leveling layer and the light-emitting-device layer;

the light emitting base plate further comprises an optical regulating layer provided on the bonding layer, and the optical regulating layer comprises optical regulating structures that correspond to the light emitting devices one to one; and the optical regulating structures are configured for regulating emergent angles of light rays exiting from the light emitting devices toward a display panel.

Optionally, a refractive index of the optical regulating structures is greater than a refractive index of the bonding layer.

Optionally, orthographic projections of the optical regulating structures on the substrate cover orthographic projections of the light emitting devices on the substrate.

Optionally, a surface of a side of each of the optical regulating structures that is further away from the substrate is an arc face, and the arc face protrudes in a direction away from the substrate.

Optionally, the plurality of light emitting devices comprised in the light-emitting-device layer are classified into a first micro-LED (Light Emitting Diode) device, a second micro-LED device and a third micro-LED device; and the first micro-LED device is a red-light micro-LED device, the second micro-LED device is a green-light micro-LED device, and the third micro-LED device is a blue-light micro-LED device;

or, the first micro-LED device comprises a blue-light micro-LED device and a first light converting layer provided on a light exiting face of the blue-light micro-LED device, the second micro-LED device comprises a blue-light micro-LED device and a second light converting layer provided on a light exiting face of the blue-light micro-LED device, the third micro-LED device comprises a blue-light micro-LED device, and a fluorescent material of the first light converting layer and a fluorescent material of the second light converting layer are different.

The present disclosure further discloses a method for fabricating a light emitting base plate, wherein the method comprises:

forming a light shielding layer on a substrate;

forming a driving functional layer on the light shielding layer; and forming a light-emitting-device layer and a light absorbing layer on the driving functional layer;

wherein the light-emitting-device layer comprises a plurality of light emitting devices, and the light absorbing layer comprises light absorbing structures each of which surrounds sides of one of the light emitting devices, wherein the sides of the light emitting device refer to surfaces of the light emitting device that are in a direction perpendicular to the substrate; and the light absorbing structures are configured for blocking light rays exiting from the sides of the light emitting devices.

Optionally, the step of forming the driving functional layer on the light shielding layer comprises:

forming sequentially a first passivation layer, a first electrically conductive layer, a second passivation layer, a second electrically conductive layer and a third electrically conductive layer on the light shielding layer;

wherein the second electrically conductive layer is connected to the first electrically conductive layer via a first via hole penetrating the second passivation layer, and the third electrically conductive layer comprises a first electrically conductive structure and a second electrically conductive structure.

Optionally, the step of forming the driving functional layer on the light shielding layer comprises:

forming sequentially a flat layer, a first passivation layer, a first electrically conductive layer, a second passivation layer, a second electrically conductive layer and a third electrically conductive layer on the light shielding layer;

wherein the flat layer covers the light shielding layer and the substrate.

Optionally, after the step of forming the light-emitting-device layer and the light absorbing layer on the driving functional layer, the method further comprises:

forming a leveling layer on the driving functional layer;

forming a bonding layer covering the leveling layer and the light-emitting-device layer; and forming an optical regulating layer on the bonding layer;

wherein and the optical regulating layer comprises optical regulating structures that correspond to the light emitting devices one to one; and the optical regulating structures are configured for regulating emergent angles of light rays exiting from the light emitting devices toward a display panel.

The present disclosure further discloses a displaying device, wherein the displaying device comprises a display panel and the light emitting base plate stated above;

the light emitting base plate is provided on a displaying side of the display panel, and light emitting faces of the light emitting devices in the light emitting base plate face the displaying side of the display panel; and the display panel comprises an array base plate, the array base plate comprises a reflecting layer, and the reflecting layer comprises a plurality of diffuse-reflection structures.

Optionally, each of the light emitting devices corresponds to at least 20×20 diffuse-reflection structures arranged in a matrix.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

FIG. 14 shows a schematic structural diagram of the first light converting layer and the second light converting layer according to an embodiment of the present disclosure.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
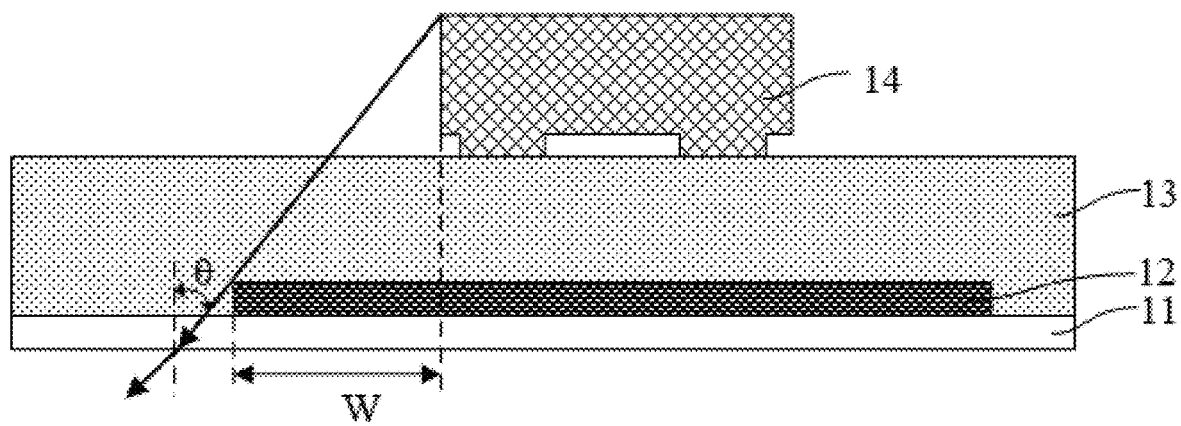
FIG. 1 shows a schematic structural diagram of a frontally placed light source in the related art.

As shown in FIG. 1, in the related art, a frontally placed light source comprises a substrate 11, a light shielding layer 12 and a driving functional layer 13 that are provided sequentially on the substrate 11, and a light emitting device 14 provided on the driving functional layer 13.

When the external ambient light is weak, the light emitting device 14 emits light normally. The light emitting device 14 does not only supply the light ray required by the displaying in the direction of the display panel, but also has side emergent lights. When the light rays exiting from the sides of the light emitting device 14 enter the interface between the substrate 11 and the external environment, if their incident angles θ are less than a critical angle of total reflection, then part of the light rays are refracted out of the interface between the substrate 11 and the external environment; in other words, part of the light rays supplied by the frontally placed light source directly exits from the light exiting face of the displaying device. Moreover, the light ray supplied by the light emitting device 14 to the display panel, after reflected by the display panel, also exits in the direction toward the substrate 11. Therefore, if the light rays exiting from the sides of the light emitting device 14 directly exits from the light exiting face of the displaying device, that affects the contrast of the displaying device.

In order to increase the contrast of the displaying device, it is usually required to increase the distance W by which the edge of light shielding layer 12 exceeds the edge of the light emitting device 14, i.e., to increase the area of coverage of the light shielding layer 12, to increase the incident angles θ when the light rays exiting from the sides of the light emitting device 14 enter the interface between the substrate 11 and the external environment, so that the incident angles θ are greater than or equal to the critical angle of total reflection, to enable the light rays to have a total reflection. Accordingly, all of the light rays exiting from the sides of the light emitting device 14 are reflected to the display panel, and are not directly refracted out of the interface between the substrate 11 and the external environment, thereby increasing the contrast of the displaying device.

However, if the area of coverage of the light shielding layer 12 is increased, that results in a reduced aperture ratio of the displaying device.

Therefore, in the embodiments of the present disclosure, by providing light absorbing structures surrounding the sides of each of light emitting devices on a driving functional layer, the light rays exiting from the sides of the light emitting devices can be blocked by the light absorbing structures, which prevents the problem that the light rays exiting from the sides of the light emitting devices directly exit from the light exiting face of the displaying device, which results in that the contrast is reduced. Furthermore, as the light absorbing structures can block the light rays exiting from the sides of the light emitting devices, the area of coverage of a light shielding layer may be correspondingly reduced, which increases the aperture ratio of the displaying device.

Figure 2:
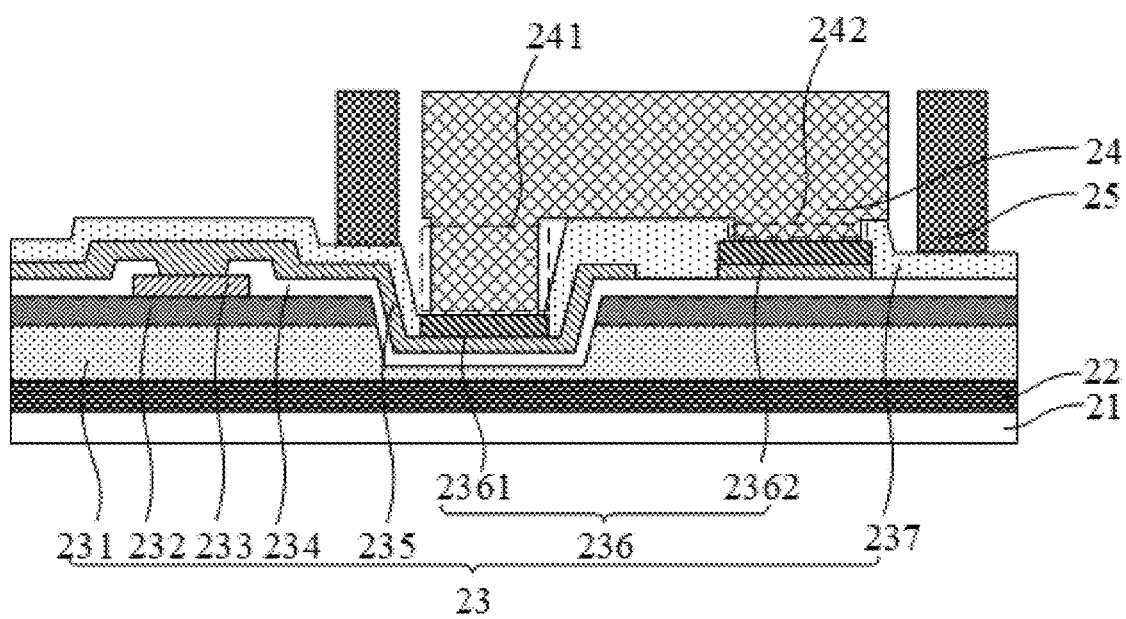
FIG. 2 shows a schematic structural diagram of a light emitting base plate according to an embodiment of the present disclosure.
Figure 3:
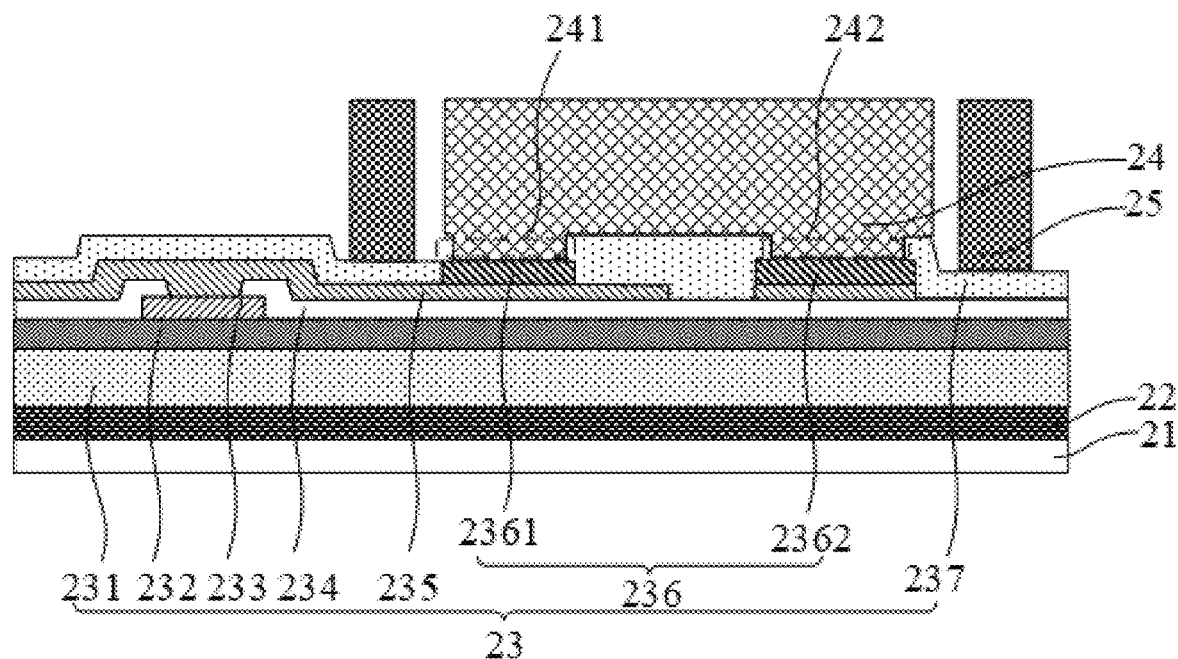
FIG. 3 shows a schematic structural diagram of another light emitting base plate according to an embodiment of the present disclosure.
Figure 4:
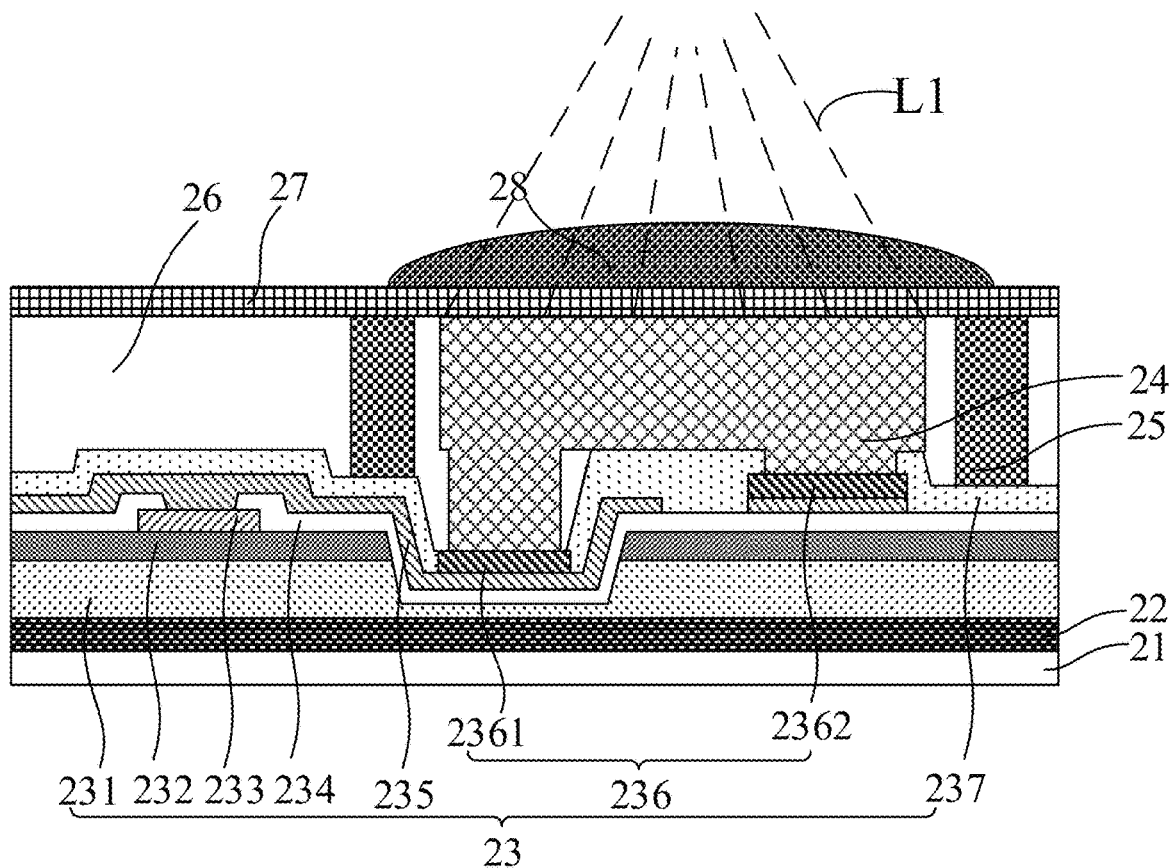
FIG. 4 shows a schematic structural diagram of yet another light emitting base plate according to an embodiment of the present disclosure.

Referring to FIG. 2, FIG. 2 shows a schematic structural diagram of a light emitting base plate according to an embodiment of the present disclosure. FIG. 3 shows a schematic structural diagram of another light emitting base plate according to an embodiment of the present disclosure. FIG. 4 shows a schematic structural diagram of yet another light emitting base plate according to an embodiment of the present disclosure.

An embodiment of the present disclosure provides a light emitting base plate. The light emitting base plate comprises: a substrate 21, a light shielding layer 22 provided on the substrate 21 and a driving functional layer 23 provided on the light shielding layer 22. As shown in FIGS. 2, 3, 4, 5, and 14, the light emitting base plate further comprises a light-emitting-device layer 1001 and a light absorbing layer that are provided on the driving functional layer 23. The light-emitting-device layer 1001 comprises a plurality of light emitting devices 24, and the light absorbing layer comprises light absorbing structures 25 each of which surrounds the sides of one of the light emitting devices 24, wherein the sides of the light emitting device 24 refer to the surfaces of the light emitting device 24 that are in the direction perpendicular to the substrate 21. The light absorbing structures 25 are configured for blocking light rays exiting from the sides of the light emitting devices 24.

Particularly, the substrate 21 may be a glass base plate, a quartz base plate, a metal base plate, a resin base plate and so on. The light shielding layer 22 is provided on the substrate 21. The material of the light shielding layer 22 is a black light shielding material, for example molybdenum oxide $MoO_x$ or a black resin material, and it is used to block the metal film layer in the driving functional layer 23, to prevent that, when the external ambient light is intensive, the external ambient light irradiates the metal film layer in the driving functional layer 23 and thus causes light reflection.

The driving functional layer 23 is used to drive the light emitting devices 24 in the light-emitting-device layer to emit light. The light-emitting-device layer comprises a plurality of light emitting devices 24 that are distributed in an array. The light emitting devices 24 may be micro-LED devices, and may also be common LED devices. The micro-LED device refers to a Micro-LED device or a Mini-LED device, the length of the Micro-LED device is less than 50 micrometers, and preferably, the length of the Micro-LED device is 10 micrometers to 50 micrometers; and the length of the Mini-LED device is 50 micrometers to 150 micrometers, and preferably, the length of the Micro-LED device is 80 micrometers to 120 micrometers. When the light emitting devices 24 are the micro-LED devices, because the Micro-LED device and the Mini-LED device have the characteristics such as a small size and a high brightness, by using the light emitting base plate comprising the micro-LED devices as the light emitting devices 24, it supplies to the display panel the light rays of a higher brightness, and makes the light emitting base plate thinner and lighter.

Because the light emitting devices 24, besides supplying to the displaying side of the display panel the light rays required by the displaying, have side emergent lights, in order to prevent the light rays exiting from the sides of the light emitting devices 24 from directly exiting from the light exiting face of the displaying device, the light absorbing structures 25 surrounding the sides of each of the light emitting devices 24 are provided on the driving functional layer 23, and therefore the light rays exiting from the sides of the light emitting devices 24 can be blocked by the light absorbing structures 25, whereby the light rays exiting from the sides of the light emitting devices 24 cannot exit from the light exiting face of the displaying device, thereby increasing the contrast of the displaying device. Furthermore, as the light absorbing structures 25 can block the light rays exiting from the sides of the light emitting devices 24, the area of coverage of the light shielding layer 22 may be correspondingly reduced, which increases the aperture ratio of the displaying device.

The material of the light absorbing structures 25 is an organic material, such as a black resin material. It allows the light rays to transmit with a transmittance less than a preset value; for example, if the preset value is 5%, then the light absorbing structures 25 allow the light rays to transmit with a transmittance less than 5%. The thickness of the light absorbing structures 25 is related to the transmittance with which the light absorbing structures 25 allow the light rays to transmit and the value of the optical density (OD) of the light absorbing structures 25; in other words, the thickness of the light absorbing structures 25 is equal to the ratio of the transmittance of the light absorbing structures 25 to the OD value of the light absorbing structures 25. Moreover, the OD value of the light absorbing structures 25 is related to the material of the light absorbing structures 25, and once the material of the light absorbing structures 25 has been determined, the OD value of the light absorbing structures 25 can be determined.

Particularly, as shown in FIGS. 2 to 4, the driving functional layer 23 comprises a first passivation layer 232, a first electrically conductive layer 233, a second passivation layer 234, a second electrically conductive layer 235 and a third electrically conductive layer 236 that are provided sequentially on the light shielding layer 22. The second electrically conductive layer 235 is connected to the first electrically conductive layer 233 via a first via hole penetrating the second passivation layer 234, and the third electrically conductive layer 236 comprises a first electrically conductive structure 2361 and a second electrically conductive structure 2362.

In an embodiment of the present disclosure, the first passivation layer 232, the first electrically conductive layer 233, the second passivation layer 234, the second electrically conductive layer 235 and the third electrically conductive layer 236 are arranged sequentially away from the substrate 21 in the direction perpendicular to the substrate 21.

Moreover, the driving functional layer 23 may further comprise a flat layer 231 provided between the light shielding layer 22 and the first passivation layer 232, and a third passivation layer 237 provided on the side of the third electrically conductive layer 236 that is further away from the substrate 21, and the third passivation layer 237 has a second via hole exposing the first electrically conductive structure 2361 and a third via hole exposing the second electrically conductive structure 2362.

The flat layer 231 covers the light shielding layer 22 and the substrate 21. The material of the flat layer 231 is an organic material, such as a resin. The first passivation layer 232 is provided on the side of the flat layer 231 that is further away from the substrate 21. The first passivation layer 232 may be a single-layer or laminated-layer structure, and the material of each of the layers is silicon oxide, silicon nitride or silicon oxynitride and so on. The first electrically conductive layer 233 is provided on the side of the first passivation layer 232 that is further away from the substrate 21. The material of the first electrically conductive layer 233 is a metal material, such as copper and silver. The second passivation layer 234 covers the first electrically conductive layer 233 and the first passivation layer 232. The second passivation layer 234 has the first via hole penetrating and exposing the first electrically conductive layer 233. The second passivation layer 234 may be a single-layer or laminated-layer structure, and the material of each of the layers is silicon oxide, silicon nitride or silicon oxynitride and so on. The second electrically conductive layer 235 is provided on the side of the second passivation layer 234 that is further away from the substrate 21. The second electrically conductive layer 235 is connected to the first electrically conductive layer 233 via the first via hole penetrating the second passivation layer 234. The material of the second electrically conductive layer 235 is a metal material, such as copper and silver. The third electrically conductive layer 236 is provided on the side of the second electrically conductive layer 235 that is further away from the substrate 21. The third electrically conductive layer 236 comprises the first electrically conductive structure 2361 and the second electrically conductive structure 2362. The first electrically conductive structure 2361 and the second electrically conductive structure 2362 are, in the same layer, provided on the second electrically conductive layer 235. The material of the third electrically conductive layer 236 is a transparent electrically conductive material, such as indium tin oxide (ITO). The third passivation layer 237 covers the second electrically conductive layer 235, the third electrically conductive layer 236 and the second passivation layer 234. The third passivation layer 237 has the second via hole penetrating and exposing the first electrically conductive structure 2361, and the third via hole penetrating and exposing the second electrically conductive structure 2362. The third passivation layer 237 may be a single-layer or laminated-layer structure, and the material of each of the layers is silicon oxide, silicon nitride or silicon oxynitride and so on.

It should be noted that, if the driving functional layer 23 does not comprise the flat layer 231 provided between the light shielding layer 22 and the first passivation layer 232, the first passivation layer 232 directly covers the light shielding layer 22 and the substrate 21.

Figures 5, 6:
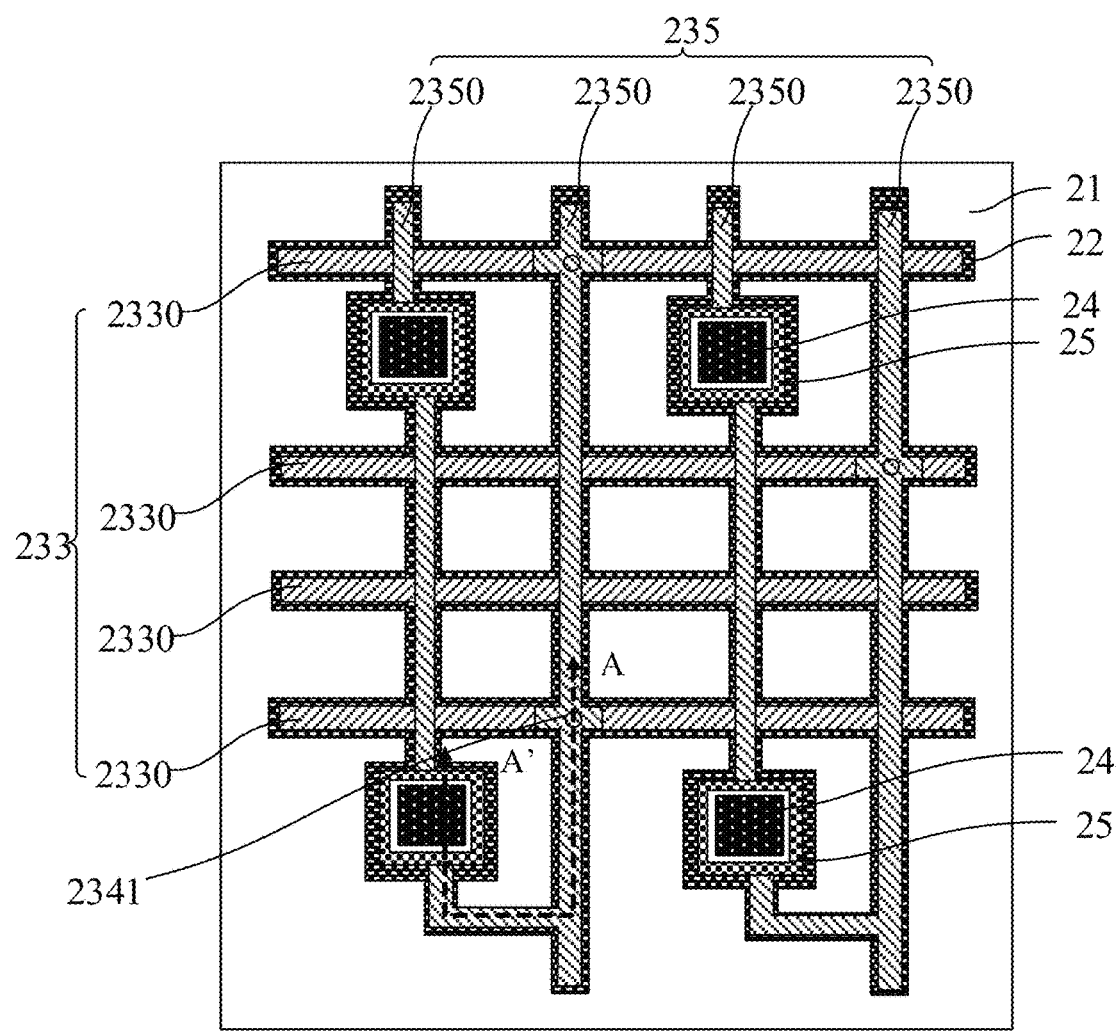
FIG. 5 shows a schematic plan view of the light emitting base plate according to an embodiment of the present disclosure.
FIG. 6 shows a flow chart of the method for fabricating a light emitting base plate according to an embodiment of the present disclosure.

Particularly, as shown in FIG. 5, the first electrically conductive layer 233 comprises a plurality of first electrically conductive lead wires 2330 that are distributed in a first direction, the second electrically conductive layer 235 comprises a plurality of second electrically conductive lead wires 2350 that are distributed in a second direction, the first direction and the second direction have a preset included angle, and the preset included angle is not 0. For example, the preset included angle is 90°; in other words, the first direction and the second direction are perpendicular to each other. When the first direction and the second direction are perpendicular to each other, the first direction is parallel to the row direction of the display panel, and the second direction is parallel to the column direction of the display panel; or, the first direction is parallel to the column direction of the display panel, and the second direction is parallel to the row direction of the display panel.

It should be noted that the sectional view that is obtained along the cross section A-A' of the light emitting base plate shown in FIG. 5 is the structure shown in FIGS. 2 to 4, 2341 is the first via hole penetrating the second passivation layer 234, and the second electrically conductive layer 235 is connected to the first electrically conductive layer 233 via the first via hole 2341.

In addition, it can be seen from FIG. 5 that the light absorbing structures 25 surround the sides of the light emitting devices 24, the light absorbing structures 25 encircle the sides of the light emitting devices 24, and each of the orthographic projections of the light absorbing structures 25 on the substrate 21 is a rectangular annular structure; in other words, the orthographic projection of the side of each of the light absorbing structures 25 that is closer to the light emitting devices 24 on the substrate 21 is rectangular, and the orthographic projection of the side of each of the light absorbing structures 25 that is further away from the light emitting devices 24 on the substrate 21 is also rectangular. Certainly, the orthographic projections of the light absorbing structures 25 on the substrate 21 may also be another closed annular structure, for example a circle annular structure; in other words, the orthographic projection of the side of each of the light absorbing structures 25 that is closer to the light emitting devices 24 on the substrate 21 is circular, and the orthographic projection of the side of each of the light absorbing structures 25 that is further away from the light emitting devices 24 on the substrate 21 is also circular.

In an embodiment of the present disclosure, each of the light emitting devices 24 comprises an anode lead 241 and a cathode lead 242. The anode lead 241 is connected to the first electrically conductive structure 2361. The cathode lead 242 is connected to the second electrically conductive structure 2362.

Particularly, the first electrically conductive structure 2361 and the second electrically conductive structure 2362 are, in the same layer, provided on the second electrically conductive layer 235, and the first electrically conductive structure 2361 and the second electrically conductive structure 2362 are connected to the second electrically conductive layer 235.

When the driving functional layer 23 further comprises the third passivation layer 237 provided on the side of the third electrically conductive layer 236 that is further away from the substrate 21, the light emitting devices 24 are particularly provided on the third passivation layer 237 in the driving functional layer 23, the anode lead 241 of each of the light emitting devices 24 is connected to the first electrically conductive structure 2361 via the second via hole penetrating the third passivation layer 237, and the cathode lead 242 of each of the light emitting device 24 is connected to the second electrically conductive structure 2362 via third via hole penetrating the third passivation layer 237. In addition, the light absorbing structures 25 are also particularly provided on the third passivation layer 237 in the driving functional layer 23.

Certainly, the driving functional layer 23 may not comprise the third passivation layer 237. At this point, the anode lead 241 of each of the light emitting devices 24 directly contacts and is connected to the first electrically conductive structure 2361, and the cathode lead 242 of each of the light emitting devices 24 directly contacts and is connected to the second electrically conductive structure 2362.

It should be noted that, at a position between the first electrically conductive structure 2361 and the second electrically conductive structure 2362, the second electrically conductive lead wires 2350 comprised in the second electrically conductive layer 235 are disconnected.

The particular process of driving the light emitting devices 24 is: a signal input end supplies a driving signal to the first electrically conductive lead wires 2330 comprised in the first electrically conductive layer 233, then the driving signal is transmitted via the first via hole 2341 to the corresponding second electrically conductive lead wires 2350, the second electrically conductive lead wires 2350 transmit the driving signal to the first electrically conductive structure 2361, then the first electrically conductive structure 2361 transmits the driving signal to the anode lead 241 of each of the light emitting devices 24, then the driving signal flows through the light emitting devices 24, and is transmitted from the cathode lead 242 of each of the light emitting devices 24 to the second electrically conductive structure 2362, and the second electrically conductive structure 2362 transmits the driving signal flowing through the light emitting devices 24 to the second electrically conductive lead wires 2350, and transmits the driving signal via the second electrically conductive lead wires 2350 to a signal output end. Therefore, based on the driving signal flowing through the light emitting devices, the light emitting devices 24 can be controlled to emit light normally.

In an alternative embodiment of the present disclosure, as shown in FIG. 3, the driving functional layer 23 further comprises a flat layer 231 provided between the light shielding layer 22 and the first passivation layer 232. In the direction perpendicular to the substrate 21, the height of the anode lead 241 and the height of the cathode lead 242 are equal, the thickness of the flat layer 231 at the position that corresponds to the anode lead 241 and the thickness of the flat layer 231 at the position that corresponds to the cathode lead 242 are equal, and the thickness of the first passivation layer 232 at the position that corresponds to the anode lead 241 and the thickness of the first passivation layer 232 at the position that corresponds to the cathode lead 242 are also equal.

In the practical product, the height of the anode lead 241 and the height of the cathode lead 242 of each of the light emitting devices 24 used in the light emitting base plate may be equal. At this point, in order to ensure that, after the light emitting device 24 has been fixed to the driving functional layer 23, the surface of the side of the light emitting device 24 that is further away from the substrate 21 can be parallel to the substrate 21, the first passivation layer 232 and the flat layer 231 are not required to be patterned to form a depressed structure. At this point, the thickness of the flat layer 231 at the position that corresponds to the anode lead 241 and the thickness of the flat layer 231 at the position that corresponds to the cathode lead 242 are equal, and the thickness of the first passivation layer 232 at the position that corresponds to the anode lead 241 and the thickness of the first passivation layer 232 at the position that corresponds to the cathode lead 242 are also equal; in other words, both of the surface of the side of the flat layer 231 that is further away from the substrate 21 and the surface of the side of the first passivation layer 232 that is further away from the substrate 21 are intact planes, and no tapping area exists.

In another alternative embodiment of the present disclosure, as shown in FIG. 2, the driving functional layer 23 further comprises a flat layer 231 provided between the light shielding layer 22 and the first passivation layer 232. In the direction perpendicular to the substrate 21, the height of the anode lead 241 and the height of the cathode lead 242 are not equal, and, at the position corresponding to the anode lead 241 or the cathode lead 242 whoever has the maximum height, each of the flat layer 231 and the first passivation layer 232 has a depressed structure that depresses in the direction toward the substrate 21.

In the practical product, the height of the anode lead 241 and the height of the cathode lead 242 of each of the light emitting devices 24 used in the light emitting base plate may be not equal. At this point, in order to ensure that, after the light emitting device 24 has been fixed to the driving functional layer 23, the surface of the side of the light emitting device 24 that is further away from the substrate 21 can be parallel to the substrate 21, it is required to, at the position corresponding to the anode lead 241 or the cathode lead 242 whoever has the maximum height, pattern the first passivation layer 232 and the flat layer 231 to form the depressed structures. At this point, at the position corresponding to the anode lead 241 or the cathode lead 242 whoever has the maximum height, each of the flat layer 231 and the first passivation layer 232 has a depressed structure that depresses in the direction toward the substrate 21; in other words, the surface of the side of the flat layer 231 that is further away from the substrate 21 and the surface of the side of the first passivation layer 232 that is further away from the substrate 21 are not intact planes, and tapping areas exist.

For example, if the height of the anode lead 241 is greater than the height of the cathode lead 242, then, at the position corresponding to the anode lead 241, the first passivation layer 232 and the flat layer 231 are patterned to form the depressed structures, whereby each of the flat layer 231 and the first passivation layer 232 has a depressed structure that depresses in the direction toward the substrate 21 at the positions corresponding to the anode lead 241.

It should be noted that the height of the anode lead 241 refers to the distance, at the corresponding position of the anode lead 241, between the surface of the side of the light emitting device 24 that is closer to the substrate 21 and the surface of the side of the third electrically conductive layer 236 that is further away from the substrate 21. The height of the cathode lead 242 refers to the distance, at the corresponding position of the cathode lead 242, between the surface of the side of the light emitting device 24 that is closer to the substrate 21 and the surface of the side of the third electrically conductive layer 236 that is further away from the substrate 21. The surface of the side of the light emitting device 24 that is closer to the substrate 21 refers to the surface of the side of the part of the light emitting device 24 other than the anode lead 241 and the cathode lead 242 that is closer to the substrate 21. The depth of the depressed structures is determined according to the height difference between the anode lead 241 and the cathode lead 242. When the height difference between the anode lead 241 and the cathode lead 242 is less than or equal to the thickness of the first passivation layer 232, it is merely required to pattern the first passivation layer 232. Moreover, when the height difference between the anode lead 241 and the cathode lead 242 is greater than the thickness of the first passivation layer 232, not only it is required to pattern the first passivation layer 232, but also it is required to etch the flat layer 231.

By, according to the heights of the anode lead 241 and the cathode lead 242 of each of the light emitting devices 24, reasonably configuring the structures of the flat layer 231 and the first passivation layer 232, after the light emitting device 24 has been fixed to the driving functional layer 23, the surface of the side of the light emitting device 24 that is further away from the substrate 21 is parallel to the substrate 21, which ensures that the light emitting device 24 can accurately supply a light ray to the corresponding position of the displaying side of the display panel.

In an embodiment of the present disclosure, as shown in FIG. 5, all of the orthographic projection of the first electrically conductive layer 233 on the substrate 21, the orthographic projection of the second electrically conductive layer 235 on the substrate 21 and the orthographic projections of the light emitting devices 24 on the substrate 21 are located within the orthographic projection of the light shielding layer 22 on the substrate 21.

Because both of the materials of the first electrically conductive layer 233 and the second electrically conductive layer 235 are a metal material, if the external ambient light directly irradiates the first electrically conductive layer 233 and the second electrically conductive layer 235, reflection happens, which results in that the displaying device has light reflection. Therefore, by blocking the first electrically conductive layer 233 and the second electrically conductive layer 235 in the driving functional layer 23 by using the light shielding layer 22, the light reflection caused by the irradiation by the external ambient light to the first electrically conductive layer 233 and the second electrically conductive layer 235 can be prevented. Furthermore, because the materials of the anode lead 241 and the cathode lead 242 of each of the light emitting devices 24 are also a metal material, the light shielding layer 22 also blocks the light emitting device 24, which, correspondingly, can prevent the light emission caused by the irradiation by the external ambient light to the leads of the light emitting device 24.

Moreover, the orthographic projections of the light absorbing structures 25 on the substrate 21 are also located within the orthographic projection of the light shielding layer 22 on the substrate 21, and the orthographic projection of the third electrically conductive layer 236 on the substrate 21 is also located within the orthographic projection of the light shielding layer 22 on the substrate 21.

In an embodiment of the present disclosure, the distance from the surface of the side of the light absorbing structure 25 that is further away from the substrate 21 to the substrate 21 is less than or equal to the distance from the surface of the side of the light emitting device 24 that is further away from the substrate 21 to the substrate 21.

When the distance from the surface of the side of the light absorbing structure 25 that is further away from the substrate 21 to the substrate 21 is equal to the distance from the surface of the side of the light emitting device 24 that is further away from the substrate 21 to the substrate 21, the surface of the side of the light absorbing structure 25 that is further away from the substrate 21 and the surface of the side of the light emitting device 24 that is further away from the substrate 21 are located in the same plane.

Because, in the actual fabrication process, the light absorbing structures 25 are firstly fabricated on the driving functional layer 23, and then the light emitting devices 24 are transferred to the driving functional layer 23 by using the technique of mass transfer. After the light emitting devices 24 have been transferred to the driving functional layer 23, it is further required to press-fit the light emitting devices 24 and the third electrically conductive layer 236 in the driving functional layer 23 by press fitting. If the distance from the surface of the side of the light absorbing structures 25 that is further away from the substrate 21 to the substrate 21 is greater than the distance from the surface of the side of the light emitting devices 24 that is further away from the substrate 21 to the substrate 21, then, because of the existence of the light absorbing structures 25, the light emitting devices 24 cannot be stably press-fitted and fixed to the third electrically conductive layer 236, which in turn results in bad contact between the light emitting devices 24 and the third electrically conductive layer 236. Therefore, in order to ensure that, after the press fitting, the light emitting devices 24 can be stably fixed to the third electrically conductive layer 236, it is required to reasonably set the height of the light absorbing structures 25 in the direction perpendicular to the substrate 21, so that, after the light emitting devices 24 have been fixed to the driving functional layer 23, the distance from the surface of the side of the light absorbing structure 25 that is further away from the substrate 21 to the substrate 21 is less than or equal to the distance from the surface of the side of the light emitting device 24 that is further away from the substrate 21 to the substrate 21.

Optionally, as shown in FIG. 4, the light emitting base plate further comprises a leveling layer 26 provided on the driving functional layer 23, and a bonding layer 27 that covers the leveling layer 26 and the light-emitting-device layer. The light emitting base plate further comprises an optical regulating layer provided on the bonding layer 27, and the optical regulating layer comprises optical regulating structures 28 that correspond to the light emitting devices 24 one to one. The optical regulating structures 28 are configured for regulating the emergent angles of the light rays exiting from the light emitting devices 24 toward the display panel.

Particularly, when the distance from the surface of the side of the light absorbing structure 25 that is further away from the substrate 21 to the substrate 21 is less than the distance from the surface of the side of the light emitting device 24 that is further away from the substrate 21 to the substrate 21, the leveling layer 26 does not only fill the area between the light emitting device 24 and the light absorbing structure 25 and the area of the light absorbing structure 25 that is further away from the light emitting device 24, but also covers the surface of the side of the light absorbing structure 25 that is further away from the substrate 21, whereby the surface of the side of the leveling layer 26 that is further away from the substrate 21 and the surface of the side of the light emitting device 24 that is further away from the substrate 21 are located in the same plane, at which point the bonding layer 27 covers the leveling layer 26 and the light-emitting-device layer. When the distance from the surface of the side of the light absorbing structure 25 that is further away from the substrate 21 to the substrate 21 is equal to the distance from the surface of the side of the light emitting device 24 that is further away from the substrate 21 to the substrate 21, the leveling layer 26 fills the area between the light emitting device 24 and the light absorbing structure 25 and the area of the light absorbing structure 25 that is further away from the light emitting device 24, and the thickness of the leveling layer 26 is related to the thicknesses of the light emitting device 24 and the light absorbing structure 25, whereby the surface of the side of the leveling layer 26 that is further away from the substrate 21 and the surface of the side of the light emitting device 24 that is further away from the substrate 21 are located in the same plane, at which point the bonding layer 27 does not only cover the leveling layer 26 and the light-emitting-device layer, but also covers the light absorbing layer.

Moreover, an optical regulating layer is provided on the side of the bonding layer 27 that is further away from the substrate 21, the optical regulating layer comprises optical regulating structures 28 that correspond to the light emitting devices 24 one to one, and the optical regulating structures 28 are configured for regulating the emergent angles of the light rays exiting from the light emitting devices 24 toward the display panel.

By providing the optical regulating structures 28 at the light emitting faces of the light emitting devices 24, the emergent angles of the light rays exiting from the light emitting base plate to the displaying side of the display panel can be effectively regulated, thereby reducing the interference between the pixels of the displaying device caused by the mutual interference between the reflected lights. Particularly, the optical regulating structures 28 reduce the emergent angles of the light rays exiting from the light emitting devices 24 toward the display panel; in other words, the optical regulating structures 28 converge the light rays exiting from the light emitting devices 24 toward the display panel.

For example, regarding two neighboring light emitting devices B1, B2 in the light-emitting-device layer, which correspond to pixels individually named as a pixel 1 and a pixel 2, the light emitting device B1 is used to supply a red incident light ray to the pixel 1, wherein after the red incident light ray has been reflected by the pixel 1, the red reflected light is supplied to the displaying side of the displaying device; and the light emitting device B2 is used to supply a green incident light ray to the pixel 2, wherein after the green incident light ray has been reflected by the pixel 2, the green reflected light is supplied to the displaying side of the displaying device. If the emergent angle of the light ray exiting from the light emitting device B1 toward the display panel is larger, then the light emitting device B1 does not only supply the red incident light ray to the pixel 1, but also supplies the red incident light ray to the pixel 2. Therefore, the light ray that the pixel 2 actually receives comprises the red incident light ray supplied by the light emitting device B1 and the green incident light ray supplied by the light emitting device B2. Therefore, the light ray that is reflected by the pixel 2 to the displaying side of the displaying device actually comprises the mixed light of the red light and the green light, rather than the green light required originally. Therefore, if the emergent angles of the light rays exiting from the light emitting devices 24 toward the display panel are too large, that results in interference between the pixels of the displaying device caused by the mutual interference between the reflected lights.

The material of the leveling layer 26 is silica gel. The material of the bonding layer 27 is an Optically Clear Adhesive (OCA). The material of the optical regulating structures 28 is an organic material, such as a resin-type photoresist.

In an embodiment of the present disclosure, the refractive index of the optical regulating structures 28 is greater than the refractive index of the bonding layer 27. The refractive index of the bonding layer 27 is generally 1.6, and therefore the refractive index of the optical regulating structures 28 is greater than 1.6.

By reasonably selecting the material of the optical regulating structures 28, to enable the refractive index of the optical regulating structures 28 to be greater than the refractive index of the bonding layer 27, the light rays exiting from the light emitting devices 24 are refracted when passing through the interface between the bonding layer 27 and the optical regulating structures 28, and, because the refractive index of the optical regulating structures 28 is greater than the refractive index of the bonding layer 27, the incident angles of the light rays that enter the interface between the bonding layer 27 and the optical regulating structures 28 are greater than the incident angles of the light rays that have been refracted. Therefore, after the light rays exiting from the light emitting devices 24 toward the display panel have passed through the bonding layer 27 and the optical regulating structures 28, their emergent angles are reduced.

In an embodiment of the present disclosure, the orthographic projections of the optical regulating structures 28 on the substrate 21 cover the orthographic projections of the light emitting devices 24 on the substrate 21.

By reasonably configuring the positions and the areas of coverage of the optical regulating structures 28, to enable the orthographic projections of the optical regulating structures 28 on the substrate 21 to cover the orthographic projections of the light emitting devices 24 on the substrate 21, all of the light rays exiting from the light emitting devices 24 toward the display panel are required to pass through the optical regulating structures 28, which ensures that the optical regulating structures 28 regulate the emergent angles of all of the light rays exiting from the light emitting devices 24 toward the display panel, to further reduce the interference between the pixels of the displaying device caused by the mutual interference between the reflected lights.

Moreover, the orthographic projections of the optical regulating structures 28 on the substrate 21 and the orthographic projections of the light absorbing structures 25 on the substrate 21 may have a coinciding area, and may not have a coinciding area, which is not limited in the embodiments of the present disclosure.

It should be noted that each of the light emitting devices 24 corresponds to a certain quantity of pixels, and the focus of the optical regulating structures 28 mainly depends on the distance between the light emitting base plate and the display panel, and the ratios of the quantities of the pixels corresponding to each of the light emitting devices 24.

In an embodiment of the present disclosure, the surface of the side of each of the optical regulating structures 28 that is further away from the substrate 21 is an arc face, and the arc face protrudes in the direction away from the substrate 21.

In the practical product, by reasonably configuring the shape of the optical regulating structures 28, the emergent angles of the light rays exiting from the light emitting devices 24 toward the display panel are further regulated. In the practical product, it is required to select the shape of the optical regulating structures 28 according to the distance between the light emitting base plate and the display panel, to enable the light rays exiting from the light emitting devices 24 toward the display panel, after passing through the optical regulating structures 28, to reach the suitable emergent angles.

When the distance between the light emitting base plate and the display panel varies, the shape of the optical regulating structures 28 also varies. The shape of the optical regulating structures 28 is defined mainly by using the contact angle of the optical regulating structures 28, wherein the contact angle refers to the included angle between a surface tangent of an optical regulating structure 28 and the surface of the side of the bonding layer 27 that is further away from the substrate 21.

In an embodiment of the present disclosure, the plurality of light emitting devices 24 comprised in the light-emitting-device layer are classified into a first micro-LED device, a second micro-LED device and a third micro-LED device. The first micro-LED device is a red-light micro-LED device, the second micro-LED device is a green-light micro-LED device, and the third micro-LED device is a blue-light micro-LED device; or, the first micro-LED device comprises a blue-light micro-LED device and a first light converting layer provided on a light exiting face of the blue-light micro-LED device, the second micro-LED device comprises a blue-light micro-LED device and a second light converting layer provided on a light exiting face of the blue-light micro-LED device, the third micro-LED device comprises a blue-light micro-LED device, and a fluorescent material of the first light converting layer and a fluorescent material of the second light converting layer are different.

Particularly, the plurality of light emitting devices 24 comprised in the light-emitting-device layer are classified into three types, which are a first micro-LED device, a second micro-LED device and a third micro-LED device, wherein the light ray emitted by the first micro-LED device is a red light, the light ray emitted by the second micro-LED device is a green light, and the light ray emitted by the third micro-LED device is a blue light. Certainly, the types that the plurality of light emitting devices 24 comprised in the light-emitting-device layer are classified into are not limited to three types, and may also be two types, four types and so on.

In a first structure, the first micro-LED device is a red-light micro-LED device, the second micro-LED device is a green-light micro-LED device, and the third micro-LED device is a blue-light micro-LED device, wherein the light ray emitted by the red-light micro-LED device is a red light, the light ray emitted by the green-light micro-LED device is a green light, and the light ray emitted by the blue-light micro-LED device is a blue light. Therefore, by controlling the red-light micro-LED device, the green-light micro-LED device and the blue-light micro-LED device to emit the light rays, and by controlling the brightnesses of the emitted light rays and so on, the displaying side of the display panel is supplied with light rays of various colors.

In a second structure, all of the first micro-LED device, the second micro-LED device and the third micro-LED device comprise a blue-light micro-LED device, the first micro-LED device further comprises a first light converting layer provided on the light exiting face of the blue-light micro-LED device, the second micro-LED device further comprises a second light converting layer provided on the light exiting face of the blue-light micro-LED device, the first light converting layer may convert the blue light emitted by the blue-light micro-LED device into a red light, and the second light converting layer may convert the blue light emitted by the blue-light micro-LED device into a green light.

Because the cost of the blue-light micro-LED device is less than the costs of the red-light micro-LED device and the green-light micro-LED device, in the light-emitting-device layer, as compared with the supplying of the light rays to the displaying side of the display panel by providing the red-light micro-LED device, the green-light micro-LED device and the blue-light micro-LED device, by supplying the light rays by using the cooperation between the blue-light micro-LED device and the light converting layers, the fabrication cost of the light emitting base plate can be effectively reduced.

It should be noted that the light rays supplied by the light emitting base plate according to the embodiments of the present disclosure include a red light, a green light and a blue light, and are not white light. Therefore, the light absorbing structures 25 encircling the sides of the light emitting devices 24, after blocking the light rays exiting from the sides of the light emitting devices 24, do not only increase the contrast of the displaying device, but can also prevent the interference on the light rays reflected by the display panel by the light rays exiting from the sides of the light emitting devices 24.

In the embodiments of the present disclosure, by providing the light absorbing structures surrounding the sides of each of the light emitting devices on the driving functional layer, the light rays exiting from the sides of the light emitting devices can be blocked by the light absorbing structures, which prevents the problem that the light rays exiting from the sides of the light emitting devices directly exit from the light exiting face of the displaying device, which results in that the contrast is reduced. Furthermore, as the light absorbing structures can block the light rays exiting from the sides of the light emitting devices, the area of coverage of the light shielding layer may be correspondingly reduced, which increases the aperture ratio of the displaying device.

Referring to FIG. 6, FIG. 6 shows a flow chart of the method for fabricating a light emitting base plate according to an embodiment of the present disclosure, which may particularly comprise the following steps:

Step 601: forming a light shielding layer on a substrate.

Figure 7:
FIG. 7 shows a schematic structural diagram of an embodiment of the present disclosure after the light shielding layer has been formed on the substrate.

In an embodiment of the present disclosure, as shown in FIG. 7, the substrate 21 is provided, and the light shielding layer 22 is formed on the substrate 21 by using a patterning process. If the material of the light shielding layer 22 is a black resin material, then firstly a light shielding thin film is placed on the substrate 21, and the light shielding thin film is exposed by using a mask, and is developed after the exposure, to obtain the light shielding layer 22.

Step 602: forming a driving functional layer on the light shielding layer.

In an embodiment of the present disclosure, after the light shielding layer 22 has been formed on the substrate 21, the driving functional layer 23 is formed on the light shielding layer 22.

In an alternative embodiment of the present disclosure, when the driving functional layer 23 does not comprise the flat layer 231 provided between the light shielding layer 22 and the first passivation layer 232, the step 602 particularly comprises: forming sequentially a first passivation layer, a first electrically conductive layer, a second passivation layer, a second electrically conductive layer and a third electrically conductive layer on the light shielding layer; wherein the second electrically conductive layer is connected to the first electrically conductive layer via a first via hole penetrating the second passivation layer, and the third electrically conductive layer comprises a first electrically conductive structure and a second electrically conductive structure.

Moreover, when the driving functional layer 23 further comprises the flat layer 231 provided between the light shielding layer 22 and the first passivation layer 232, the step 602 particularly comprises: forming sequentially a flat layer, a first passivation layer, a first electrically conductive layer, a second passivation layer, a second electrically conductive layer and a third electrically conductive layer on the light shielding layer.

The particular process of forming the driving functional layer 23 will be described below by taking the case in which the driving functional layer 23 comprises the flat layer 231 as an example.

Figure 8:
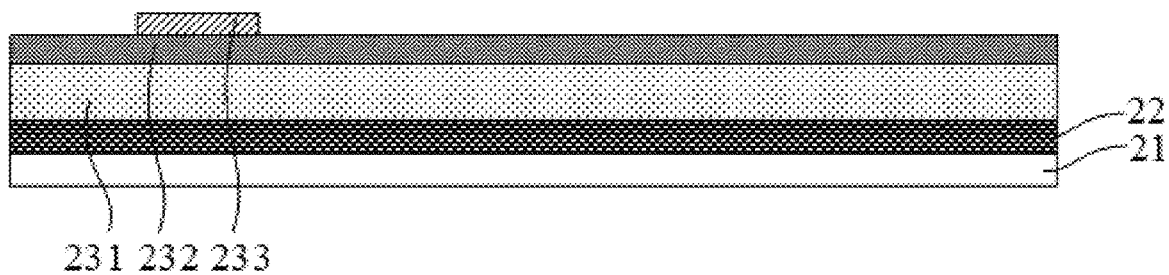
FIG. 8 shows a schematic structural diagram of an embodiment of the present disclosure after the flat layer, the first passivation layer and the first electrically conductive layer have been sequentially formed on the light shielding layer.

As shown in FIG. 8, after the light shielding layer 22 has been formed on the substrate 21, firstly the flat layer 231 is formed on the light shielding layer 22, wherein the flat layer 231 covers the light shielding layer 22 and the substrate 21. Subsequently, the first passivation layer 232 is formed on the flat layer 231, wherein the first passivation layer 232 may be formed by deposition. Subsequently, the first electrically conductive layer 233 is formed on the first passivation layer 232 by using a patterning process. The patterning process may particularly include thin film deposition, exposure, development, etching and so on.

Figure 9:
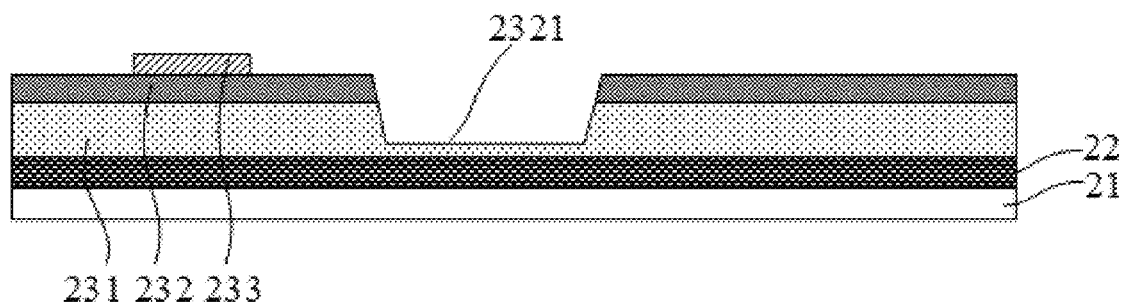
FIG. 9 shows a schematic structural diagram of an embodiment of the present disclosure after the flat layer and the first passivation layer have been patterned to form the depressed structures.

As shown in FIG. 9, if the height of the anode lead 241 and the height of the cathode lead 242 of each of the light emitting devices 24 used in the light emitting base plate are not equal, it is further required to pattern the first passivation layer 232 and the flat layer 231, to form the depressed structures 2321 that depress in the direction toward the substrate 21. Particularly, firstly a photoresist is spread-coated on the first electrically conductive layer 233 and the first passivation layer 232, and the photoresist is exposed by using a mask, and is developed after the exposure, to obtain a photoresist-removed region. The first passivation layer 232 at the photoresist-removed region is etched, to form the opening penetrating the first passivation layer 232. Subsequently, the flat layer 231 at the opening is etched, to form the depressed structure 2321. Finally, the residual photoresist is removed.

It should be noted that, if the height of the anode lead 241 and the height of the cathode lead 242 of each of the light emitting devices 24 used in the light emitting base plate are equal, the step of forming the depressed structures 2321 may be omitted.

Figure 10:
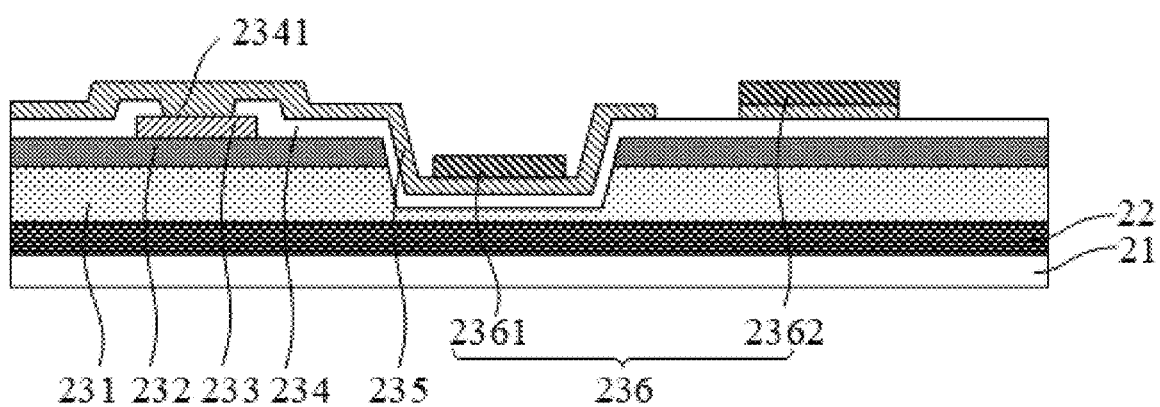
FIG. 10 shows a schematic structural diagram of an embodiment of the present disclosure after the second passivation layer, the second electrically conductive layer and the third electrically conductive layer have been formed.

As shown in FIG. 10, after the depressed structures 2321 have been formed, firstly the second passivation layer 234 is formed by deposition, wherein the second passivation layer 234 covers the first electrically conductive layer 233 and the first passivation layer 232. Subsequently, the second passivation layer 234 is patterned, to form the first via hole 2341 of the second passivation layer 234. Subsequently, a second electrically conductive thin film and a third electrically conductive thin film are deposited sequentially on the second passivation layer 234, a photoresist is spread-coated on third electrically conductive thin film, and, after exposure and development, the third electrically conductive thin film is etched by wet etching, to form the third electrically conductive layer 236, wherein the third electrically conductive layer 236 comprises the first electrically conductive structure 2361 and the second electrically conductive structure 2362. Subsequently, a photoresist is spread-coated on the third electrically conductive layer 236 and the second electrically conductive thin film, and, after exposure and development, the second electrically conductive thin film is etched by wet etching, to form the second electrically conductive layer 235, wherein the second electrically conductive layer 235 is connected to the first electrically conductive layer 233 via the first via hole 2341 penetrating the second passivation layer 234.

Figure 11:
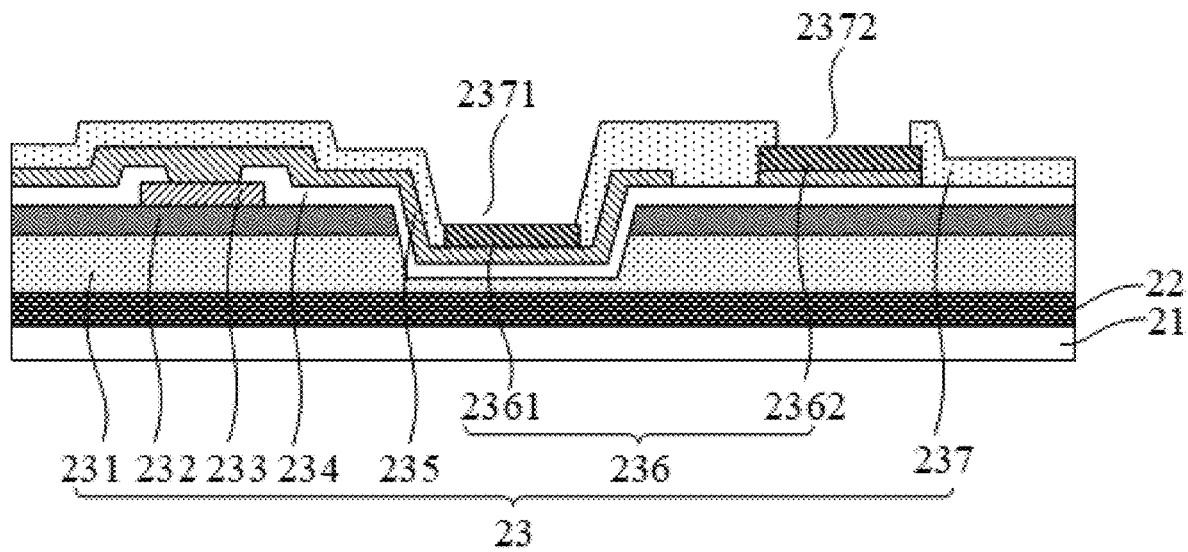
FIG. 11 shows a schematic structural diagram of an embodiment of the present disclosure after the third passivation layer has been formed.

When the driving functional layer 23 further comprises the third passivation layer 237 provided on the side of the third electrically conductive layer 236 that is further away from the substrate 21, as shown in FIG. 11, after the second electrically conductive layer 235 and the third electrically conductive layer 236 have been formed, the third passivation layer 237 covering the second electrically conductive layer 235, the third electrically conductive layer 236 and the second passivation layer 234 is formed by deposition. Subsequently, the third passivation layer 237 is patterned, to form a second via hole 2371 and a third via hole 2372 penetrating the third passivation layer 237, wherein the second via hole 2371 exposes the first electrically conductive structure 2361, and the third via hole 2372 exposes the second electrically conductive structure 2362, to finally obtain the driving functional layer 23 according to the embodiments of the present disclosure.

Step 603: forming a light-emitting-device layer and a light absorbing layer on the driving functional layer.

Figure 12:
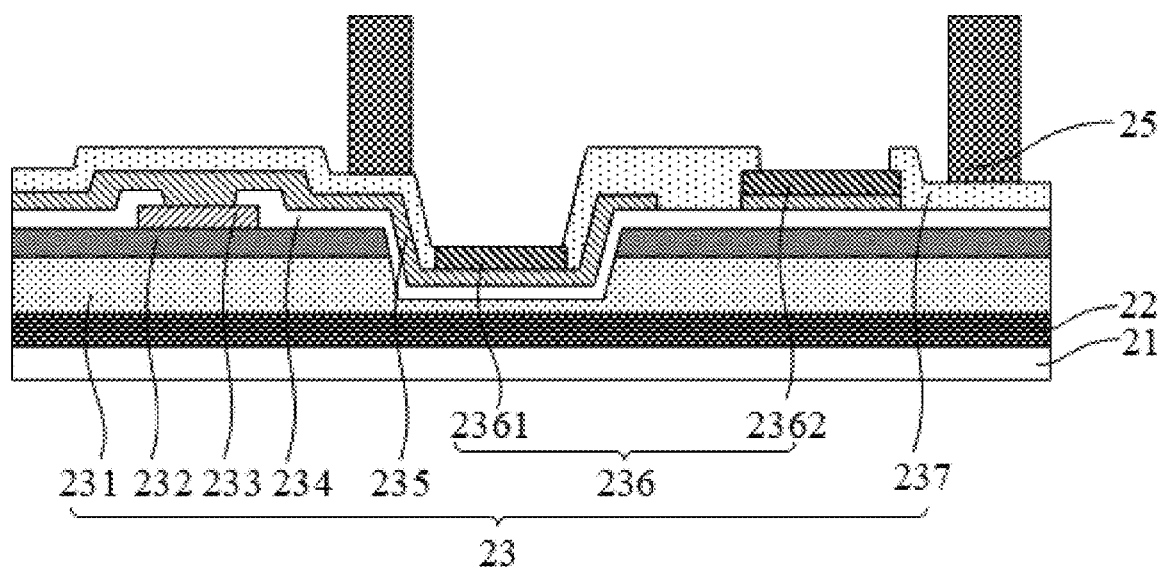
FIG. 12 shows a schematic structural diagram of an embodiment of the present disclosure after the light absorbing layer has been formed on the third passivation layer.

In an embodiment of the present disclosure, as shown in FIG. 12, after the driving functional layer 23 has been formed on the light shielding layer 22, the light absorbing layer is formed on the driving functional layer 23. Particularly, the light absorbing layer is formed on the third passivation layer 237 in the driving functional layer 23, wherein the light absorbing layer comprises a plurality of the light absorbing structures 25, and the material of the light absorbing structures 25 is an organic material.

Particularly, after the driving functional layer 23 has been formed on the light shielding layer 22, firstly a light absorbing thin film is formed on the driving functional layer 23 by spread coating, and the light absorbing thin film is exposed by using a mask, and is developed after the exposure, to obtain the light absorbing layer.

After the light absorbing layer has been formed on the driving functional layer 23, the light-emitting-device layer is formed on the driving functional layer 23, to obtain the structure shown in FIG. 2, wherein the light-emitting-device layer comprises a plurality of the light emitting devices 24.

Particularly, by using the technique of mass transfer, the anode lead 241 of each of the light emitting devices 24 is inserted into the second via holes 2371, and the cathode lead 242 of each of the light emitting devices 24 is inserted into the third via holes 2372, to realize the transfer of the light emitting devices 24 to the driving functional layer 23. Subsequently, by press fitting, the light emitting devices 24 are press-fit to the third electrically conductive layer 236 in the driving functional layer 23, to realize the fixed connection between the anode lead 241 of each of the light emitting devices 24 and the first electrically conductive structure 2361, and the fixed connection between the cathode lead 242 of each of the light emitting devices 24 and the second electrically conductive structure 2362.

The light-emitting-device layer comprises a plurality of light emitting devices 24, and the light absorbing layer comprises light absorbing structures 25 surrounding the sides of each of the light emitting devices 24, wherein the sides of the light emitting device 24 refer to the surfaces of the light emitting device 24 that are in the direction perpendicular to the substrate 21. The light absorbing structures 25 are configured for blocking light rays exiting from the sides of the light emitting devices 24.

Optionally, after the step 603, the method further comprises: forming a leveling layer on the driving functional layer; forming a bonding layer covering the leveling layer and the light-emitting-device layer; and forming an optical regulating layer on the bonding layer; wherein and the optical regulating layer comprises optical regulating structures that correspond to the light emitting devices one to one; and the optical regulating structures are configured for regulating emergent angles of light rays exiting from the light emitting devices toward a display panel.

In an embodiment of the present disclosure, after the light-emitting-device layer and the light absorbing layer have been formed on the driving functional layer 23, as shown in FIG. 4, the method may further comprise forming the leveling layer 26 on the driving functional layer 23; subsequently, forming the bonding layer 27 covering the leveling layer 26 and the light-emitting-device layer by spread coating; and, finally, forming the optical regulating layer on the bonding layer 27, wherein the optical regulating layer comprises optical regulating structures 28 that correspond to the light emitting devices 24 one to one.

Particularly, the material of the optical regulating structures 28 is an organic material, such as a resin-type photoresist. After the bonding layer 27 has been formed, an optical regulating thin film is formed on the bonding layer 27 by spread coating, and the optical regulating thin film is exposed by using a mask, and is developed after the exposure, to obtain the optical regulating layer.

In the embodiments of the present disclosure, by providing the light absorbing structures surrounding the sides of each of the light emitting devices on the driving functional layer, the light rays exiting from the sides of the light emitting devices can be blocked by the light absorbing structures, which prevents the problem that the light rays exiting from the sides of the light emitting devices directly exit from the light exiting face of the displaying device, which results in that the contrast is reduced. Furthermore, as the light absorbing structures can block the light rays exiting from the sides of the light emitting devices, the area of coverage of the light shielding layer may be correspondingly reduced, which increases the aperture ratio of the displaying device.

Figure 13:
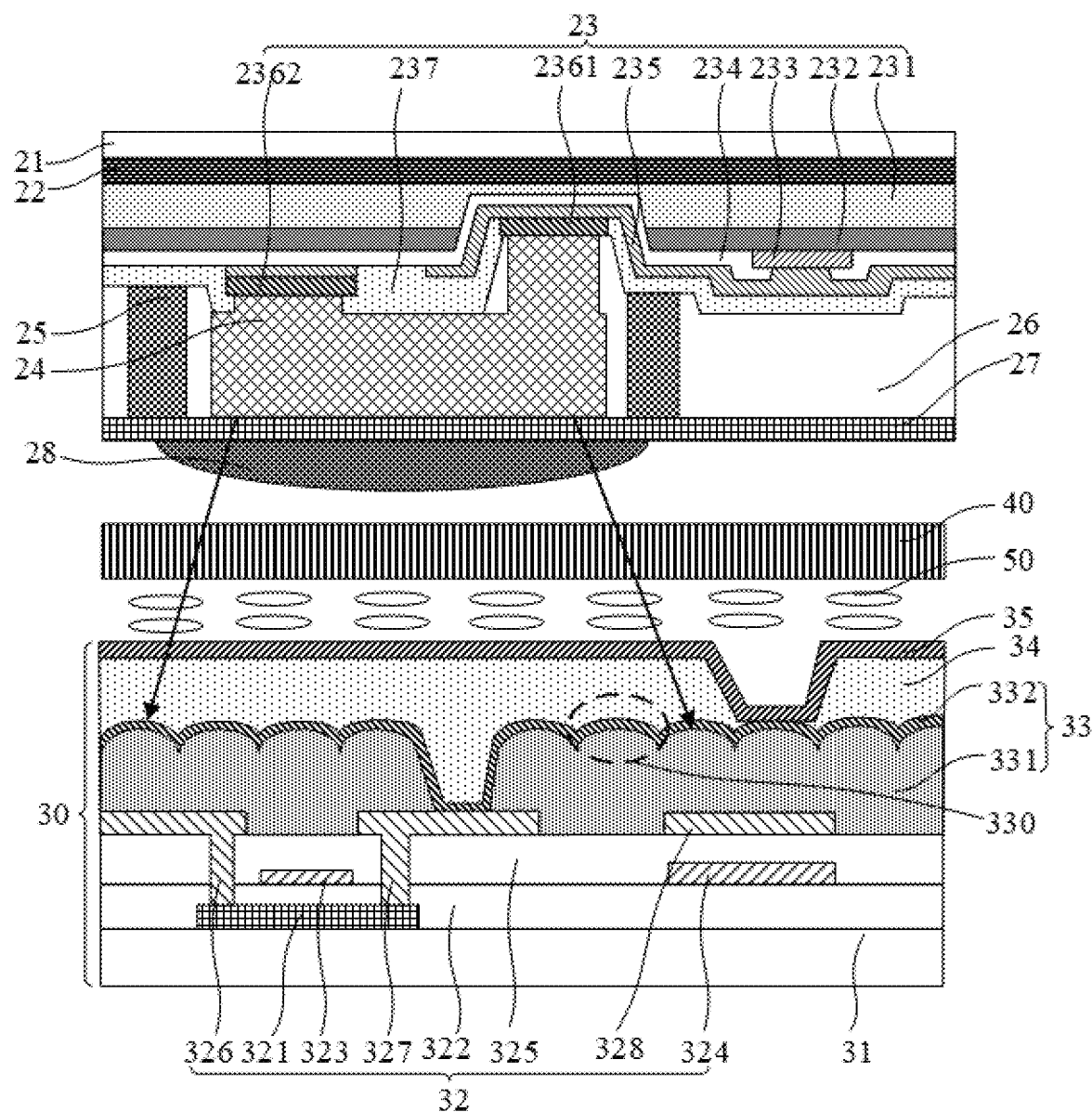
FIG. 13 shows a schematic structural diagram of the displaying device according to an embodiment of the present disclosure.
Figure 14:
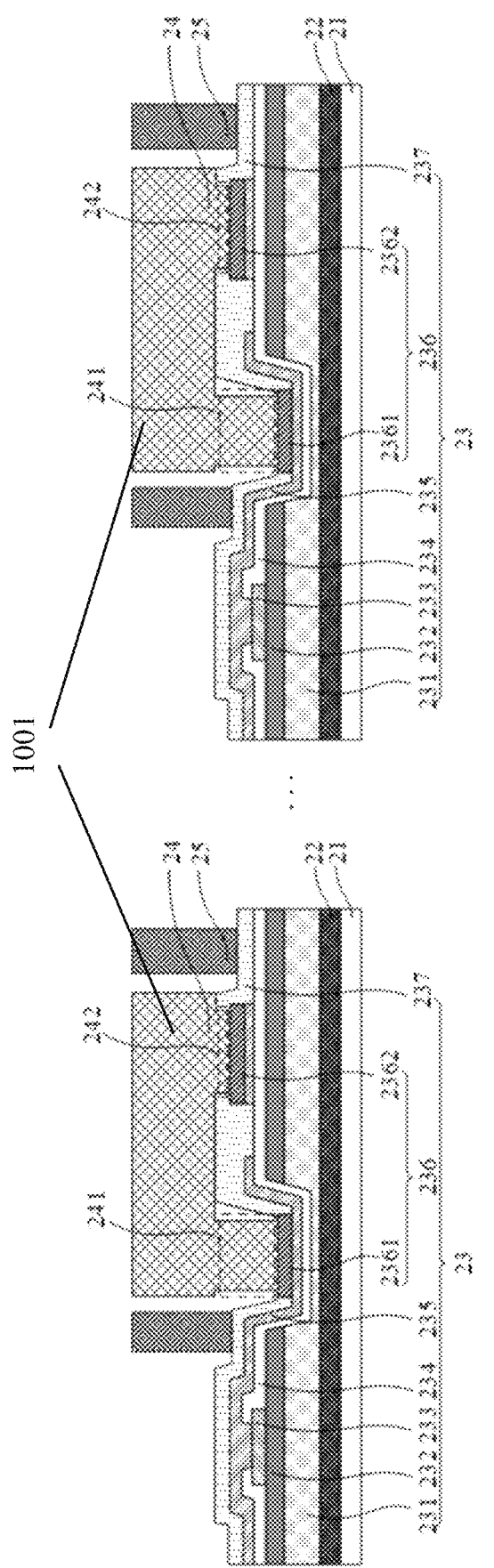
FIG. 14 shows a schematic structural diagram of a light emitting base plate according to an embodiment of the present disclosure.

Referring to FIG. 13, FIG. 13 shows a schematic structural diagram of the displaying device according to an embodiment of the present disclosure.

An embodiment of the present disclosure provides a displaying device. The displaying device comprises a display panel and the light emitting base plate stated above. The light emitting base plate is provided on a displaying side of the display panel, and the light emitting faces of the light emitting devices 24 in the light emitting base plate face the displaying side of the display panel. The display panel comprises an array base plate 30, the array base plate 30 comprises a reflecting layer 33, and the reflecting layer 33 comprises a plurality of diffuse-reflection structures 330.

Particularly, the display panel comprises the array base plate 30 and a case aligning base plate 40 that face each other, and a liquid-crystal layer 50 provided between the array base plate 30 and the case aligning base plate 40. The displaying side of the display panel refers to the side of the case aligning base plate 40 that is further away from the array base plate 30; in other words, the light emitting base plate is provided on the side of the case aligning base plate 40 that is further away from the array base plate 30.

In displaying, the light rays emitted by the light emitting devices 24 in the light emitting base plate illuminate the side of the array base plate 30; the light rays are reflected by the reflecting layer 33 in the array base plate 30, pass through the case aligning base plate 40, and further exit from the displaying side of the display panel; and the reflected light rays, after exiting from the displaying side of the display panel, enter the light emitting base plate, and exit from the opening region of the light shielding layer 22 in the light emitting base plate, to realize the displaying of the display panel. The displaying side of the displaying device refers to the side of the light emitting base plate that is further away from the display panel.

The array base plate 30 comprises a base plate 31 and a driving circuit 32 provided on the base plate 31. The driving circuit 32 comprises an active layer 321 provided on the base plate 31, a grid insulating layer 322 covering the active layer 321 and the base plate 31, a grid layer provided on the grid insulating layer 322, an interlayer dielectric layer 325 covering the grid layer and the grid insulating layer 322, and a source-drain electrode layer provided on the interlayer dielectric layer 325.

The grid layer comprises a grid line, a grid 323 and a first electrode plate 324 that are distributed in the row direction of the array base plate 30, the grid line, the grid 323 and the first electrode plate 324 are provided in the same layer, and the grid line is connected to the grid 323. The source-drain electrode layer comprises a data line, a source 326, a drain 327 and a second electrode plate 328 that are distributed in the column direction of the array base plate 30, the data line, the source 326, the drain 327 and the second electrode plate 328 are provided in the same layer, and the data line is connected to the source 326. The source 326 is connected to the active layer 321 via a fourth via hole penetrating the interlayer dielectric layer 325 and the grid insulating layer 322. The drain 327 is connected to the active layer 321 via a fifth via hole penetrating the interlayer dielectric layer 325 and the grid insulating layer 322. The first electrode plate 324 and the second electrode plate 328 face each other, to form a storage capacitor, wherein the storage capacitor is used to maintain a charging voltage inputted by the data line to pixel electrodes via drive transistors, to ensure that the pixel electrodes maintain their electric field at the displaying device.

Moreover, the array base plate 30 further comprises the reflecting layer 33 covering the source-drain electrode layer and the interlayer dielectric layer 325. The reflecting layer 33 comprises a first reflecting sublayer 331 covering the source-drain electrode layer and the interlayer dielectric layer 325, and a second reflecting sublayer 332 provided on the first reflecting sublayer 331. The first reflecting sublayer 331 has a sixth via hole penetrating it. The second reflecting sublayer 332 is connected to the drain 327 via the sixth via hole.

The material of the first reflecting sublayer 331 is an organic material, such as a resin. The material of the second reflecting sublayer 332 is a reflecting metal material, such as silver. The surface of the side of the first reflecting sublayer 331 that is further away from the base plate 31 comprises a plurality of first arc faces, and the first arc faces protrude in the direction further away from the base plate 31. The surface of the second reflecting sublayer 332 that contacts the first reflecting sublayer 331 matches with the surface of the side of the first reflecting sublayer 331 that is further away from the base plate 31. Moreover, the surface of the side of the second reflecting sublayer 332 that is further away from the base plate 31 comprises a plurality of second arc faces, the second arc faces protrude in the direction further away from the base plate 31, and the second arc faces are the reflector face of the reflecting layer 33.

Particularly, by exposure, development and high-temperature refluxing, the surface of the side of the first reflecting sublayer 331 that is further away from the base plate 31 may be fabricated into the plurality of first arc faces, and after the second reflecting sublayer 332 has been deposited on the first reflecting sublayer 331, the plurality of second arc faces are formed on the surface of the side of the second reflecting sublayer 332 that is further away from the base plate 31. Therefore, by providing the first reflecting sublayer 331, the reflecting layer 33 comprising the plurality of diffuse-reflection structures 330 can be formed without using the cumbersome halftone-mask process. The diffuse-reflection structures 330 actually refer to the first reflecting sublayer 331 and the second reflecting sublayer 332 at the corresponding positions of the first arc faces and the second arc faces.

The reflecting layer 33 comprises the plurality of diffuse-reflection structures 330. The surfaces of the sides of the diffuse-reflection structures 330 that are further away from the base plate 31 are the reflector faces, and the reflector faces are the second arc faces. By providing the diffuse-reflection structures 330, the distribution curve of the intensities of the reflected lights obtained when the incident lights of the different incident angles enter the reflector faces of the reflecting layer 33 can be close to a cosine function; in other words, the distribution curve of the intensities of the reflected lights obtained when the incident lights of the different incident angles enter the reflector faces of the reflecting layer 33 can have a normal distribution, and is substantially the same as the reflectivity curve of a Lambert reflector, so as to enable the diffuse-reflection structures 330 to form a Lambert-reflector-like reflecting structure. The Lambert-reflector reflecting structure can realize that, regardless of the direction of the incident lights, the light-emission intensities of the diffused lights in various directions are always in direct proportion to the cosine function of the incident angles, whereby the brightnesses of the lights coming in random directions are equal, which can increase the brightness uniformity and the contrast of the display panel comprising the array base plate 30. Furthermore, all of the incident lights coming in random directions, after passing through the reflector faces, can form diffuse-reflection lights in the directions perpendicular to the planes where the tangents at the points of the arc faces are located, which can enlarge the area of the visual angle of the display panel comprising the array base plate 30, thereby improving the effect of displaying of the display panel comprising the array base plate 30.

Optionally, each of the light emitting devices 24 corresponds to at least 20×20 diffuse-reflection structures 330 arranged in a matrix. By reasonably controlling the ratio of the quantity of the light emitting devices 24 to the quantity of the corresponding diffuse-reflection structures 330, the interference between the pixels of the displaying device caused by the mutual interference between the reflected lights is further reduced.

It is found by experimentation that, when one pixel corresponds to at least 10×10 diffuse-reflection structures 330 arranged in a matrix, all of the light brightnesses of the light rays of the various angles reflected by the diffuse-reflection structures 330 are equal, and each of the light emitting devices 24 corresponds to 4 pixels. Therefore, each of the light emitting devices 24 corresponds to at least 20×20 diffuse-reflection structures 330 arranged in a matrix.

As shown in FIG. 13, the array base plate 30 further comprises a planarization layer 34 covering the second reflecting sublayer 332, and a pixel electrode 35 provided on the planarization layer 34, and the pixel electrode 35 is connected to the second reflecting sublayer 332 via a seventh via hole penetrating the planarization layer 34.

In the actual fabrication process, after the display panel shown in FIG. 13 has been fabricated, the light emitting base plate and the display panel may be adhered and fixed together by using an optical adhesive, to form the displaying device.

In the embodiments of the present disclosure, the light emitting base plate is a direct-type light emitting base plate, and the display panel is a reflection-type display panel. The particular description on the light emitting base plate may refer to the description on the above embodiments, and is not discussed further in the embodiments of the present disclosure.

In practical applications, the displaying device may be a mobile phone, a tablet personal computer, a display, a notebook computer, a navigator and any other products or components that have the function of displaying.

In the embodiments of the present disclosure, by providing the light absorbing structures surrounding the sides of each of the light emitting devices on the driving functional layer, the light rays exiting from the sides of the light emitting devices can be blocked by the light absorbing structures, which prevents the problem that the light rays exiting from the sides of the light emitting devices directly exit from the light exiting face of the displaying device, which results in that the contrast is reduced. Furthermore, as the light absorbing structures can block the light rays exiting from the sides of the light emitting devices, the area of coverage of the light shielding layer may be correspondingly reduced, which increases the aperture ratio of the displaying device.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The light emitting base plate and the fabricating method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A light emitting base plate, comprising:
a substrate;
a light shielding layer, provided on the substrate;
a driving functional layer, provided on the light shielding layer;
a light-emitting-device layer, provided on the driving functional layer, wherein the light-emitting-device layer comprises a plurality of light emitting devices; and
a light absorbing layer, provided on the driving functional layer, wherein the light absorbing layer comprises light absorbing structures each of which surrounds sides of one of the plurality of light emitting devices, wherein the sides of the one of the plurality of light emitting devices refer to surfaces of the one of the plurality of light emitting devices that are in a first direction perpendicular to a top surface of the substrate, wherein a material of the light absorbing structures is an organic material, and the organic material allows light rays to transmit with a transmittance less than a preset value;
wherein the light absorbing structures are configured for blocking light rays exiting from sides of the plurality of light emitting devices;
wherein the driving functional layer comprises a first passivation layer, a first electrically conductive layer, a second passivation layer, a second electrically conductive layer and a third electrically conductive layer that are provided sequentially on the light shielding layer; and
the second electrically conductive layer is connected to the first electrically conductive layer via a first via hole penetrating the second passivation layer, and the third electrically conductive layer comprises a first electrically conductive structure and a second electrically conductive structure;
wherein the first electrically conductive layer comprises a plurality of first electrically conductive lead wires that are distributed in a second direction, the second electrically conductive layer comprises a plurality of second electrically conductive lead wires that are distributed in a third direction, the first second direction and the third direction are parallel to the top surface of the substrate and have a preset included angle, and the preset included angle is not 0.

2. The light emitting base plate according to claim 1, wherein each of the plurality of light emitting devices comprises an anode lead and a cathode lead; and
the anode lead is connected to the first electrically conductive structure, and the cathode lead is connected to the second electrically conductive structure.

3. The light emitting base plate according to claim 2, wherein the driving functional layer further comprises a third passivation layer provided on a side of the third electrically conductive layer that is further away from the substrate; and the third passivation layer is provided with a second via hole exposing the first electrically conductive structure, and a third via hole exposing the second electrically conductive structure.

4. The light emitting base plate according to claim 3, wherein the anode lead is connected to the first electrically conductive structure via the second via hole penetrating the third passivation layer, and the cathode lead is connected to the second electrically conductive structure via the third via hole penetrating the third passivation layer.

5. The light emitting base plate according to claim 1, wherein all of an orthographic projection of the first electrically conductive layer on the substrate, an orthographic projection of the second electrically conductive layer on the substrate and an orthographic projection of each of the plurality of light emitting devices on the substrate are located within an orthographic projection of the light shielding layer on the substrate.

6. A method for fabricating a light emitting base plate, comprising:

forming a light shielding layer on a substrate;

forming a driving functional layer on the light shielding layer; and forming a light-emitting-device layer and a light absorbing layer on the driving functional layer;

wherein the light-emitting-device layer comprises a plurality of light emitting devices, and the light absorbing layer comprises light absorbing structures each of which surrounds sides of one of the plurality of light emitting devices, wherein the sides of the one of the plurality of light emitting devices refer to surfaces of the one of the plurality of light emitting devices that are in a first direction perpendicular to a top surface of the substrate, wherein a material of the light absorbing structures is an organic material, and the organic material allows light rays to transmit with a transmittance less than a preset value; and the light absorbing structures are configured for blocking light rays exiting from sides of the plurality of light emitting devices;

wherein the step of forming the driving functional layer on the light shielding layer comprises:

forming sequentially a first passivation layer, a first electrically conductive layer, a second passivation layer, a second electrically conductive layer and a third electrically conductive layer on the light shielding layer;

wherein the second electrically conductive layer is connected to the first electrically conductive layer via a first via hole penetrating the second passivation layer, and the third electrically conductive layer comprises a first electrically conductive structure and a second electrically conductive structure;

wherein the first electrically conductive layer comprises a plurality of first electrically conductive lead wires that are distributed in a second direction, the second electrically conductive layer comprises a plurality of second electrically conductive lead wires that are distributed in a third direction, the second direction and the third direction are parallel to the top surface of the substrate and have a preset included angle, and the preset included angle is not 0.

7. The method according to claim 6, wherein the step of forming the driving functional layer on the light shielding layer further comprises:

forming a flat layer on the light shielding layer before the step of forming sequentially the first passivation layer, the first electrically conductive layer, the second passivation layer, the second electrically conductive layer and the third electrically conductive layer on the light shielding layer;

wherein the flat layer covers the light shielding layer and the substrate.

8. A displaying device, comprising:

a display panel and a light emitting base plate, wherein the light emitting base comprises:

a substrate;

a light shielding layer, provided on the substrate;

a driving functional layer, provided on the light shielding layer;

a light-emitting-device layer, provided on the driving functional layer, wherein the light-emitting-device layer comprises a plurality of light emitting devices; and a light absorbing layer, provided on the driving functional layer, wherein the light absorbing layer comprises light absorbing structures each of which surrounds sides of one of the plurality of light emitting devices, wherein the sides of the one of the plurality of light emitting devices refer to surfaces of the one of the plurality of light emitting devices that are in a first direction perpendicular to a top surface of the substrate, wherein a material of the light absorbing structures is an organic material, and the organic material allows light rays to transmit with a transmittance less than a preset value;

wherein the light absorbing structures are configured for blocking light rays exiting from sides of the plurality of light emitting devices;

wherein the driving functional layer comprises a first passivation layer, a first electrically conductive layer, a second passivation layer, a second electrically conductive layer and a third electrically conductive layer that are provided sequentially on the light shielding layer; and the second electrically conductive layer is connected to the first electrically conductive layer via a first via hole penetrating the second passivation layer, and the third electrically conductive layer comprises a first electrically conductive structure and a second electrically conductive structure;

wherein the first electrically conductive layer comprises a plurality of first electrically conductive lead wires that are distributed in a second direction, the second electrically conductive layer comprises a plurality of second electrically conductive lead wires that are distributed in a third direction, the second direction and the third direction are parallel to the top surface of the substrate and have a preset included angle, and the preset included angle is not 0;

wherein the light emitting base plate is provided on a displaying side of the display panel, and light emitting faces of the plurality of light emitting devices in the light emitting base plate face the displaying side of the display panel; and the display panel comprises an array base plate, the array base plate comprises a reflecting layer, and the reflecting layer comprises a plurality of diffuse-reflection structures.

* * * * *